United States Patent
Su et al.

(10) Patent No.: US 10,211,821 B2
(45) Date of Patent: Feb. 19, 2019

(54) CLOCK SIGNAL TRANSMISSION CIRCUIT AND DRIVING METHOD THEREOF, GATE DRIVING CIRCUIT, AND DISPLAY DEVICE

(71) Applicants: BOE Technology Group Co., Ltd., Beijing (CN); Beijing BOE Display Technology Co., Ltd., Beijing (CN)

(72) Inventors: Guohuo Su, Beijing (CN); Zhihua Sun, Beijing (CN); Xu Zhang, Beijing (CN); Zhihao Zhang, Beijing (CN); Guangquan He, Beijing (CN); Song Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/710,317

(22) Filed: Sep. 20, 2017

(65) Prior Publication Data

US 2018/0226959 A1    Aug. 9, 2018

(30) Foreign Application Priority Data

Feb. 6, 2017    (CN) .......................... 2017 1 0066108

(51) Int. Cl.
*G09G 3/36*    (2006.01)
*G09G 3/38*    (2006.01)
(Continued)

(52) U.S. Cl.
CPC ........... *H03K 5/15093* (2013.01); *G09G 3/20* (2013.01); *H03K 2005/00241* (2013.01)

(58) Field of Classification Search
CPC ..... H03K 5/15093; H03K 2005/00241; G09G 3/20
See application file for complete search history.

(56) References Cited

U.S. PATENT DOCUMENTS

| 7,250,788 | B2 * | 7/2007 | Lee | ....................... G09G 3/3677 326/46 |
| 7,486,268 | B2 * | 2/2009 | Jang | ...................... G09G 3/3688 345/100 |

(Continued)

FOREIGN PATENT DOCUMENTS

| CN | 103426414 A | 12/2013 |
| CN | 104505048 A | 4/2015 |

(Continued)

OTHER PUBLICATIONS

First Office Action, including Search Report, for Chinese Patent Application No. 201710066108.4, dated Dec. 25, 2018, 15 pages.

*Primary Examiner* — Kenneth B Wells
(74) *Attorney, Agent, or Firm* — Westman, Champlin & Koehler, P.A.

(57) ABSTRACT

Embodiments of the present disclosure provide a clock signal transmission circuit, a driving method thereof, a gate driving circuit, and a display device. The clock signal transmission circuit includes an input circuit, a pull-up circuit, a reset circuit, a pull-down control circuit, a pull-down circuit, and a pull-up holding circuit. According to an embodiment of the present disclosure, the clock signal source can be disconnected from each shift register unit in the gate driving circuit before a screen is displayed, preventing malfunctions of the gate driving circuit caused by an undesired high voltage on the clock signal line.

20 Claims, 7 Drawing Sheets

(51) Int. Cl.
*H03K 5/15* (2006.01)
*G09G 3/20* (2006.01)
*H03K 5/00* (2006.01)

(56) References Cited

U.S. PATENT DOCUMENTS

| | | | | |
|---|---|---|---|---|
| 8,044,908 B2* | 10/2011 | Lee | ............... | G09G 3/3677 |
| | | | | 345/94 |
| 8,098,227 B2* | 1/2012 | Lee | ............... | G09G 3/3677 |
| | | | | 345/100 |
| 8,723,844 B2* | 5/2014 | Ko | ............... | G09G 3/3677 |
| | | | | 345/204 |
| 9,048,117 B2* | 6/2015 | Miyake | ............... | G09G 3/3677 |
| 9,424,793 B2* | 8/2016 | Kitsomboonloha | ............... | |
| | | | | G09G 3/3648 |
| 9,478,310 B2* | 10/2016 | Han | ............... | G09G 3/20 |
| 9,633,620 B2 | 4/2017 | Cao | | |
| 9,715,860 B2 | 7/2017 | Yang et al. | | |
| 9,916,039 B2 | 3/2018 | Gu et al. | | |
| 2015/0228240 A1 | 8/2015 | Ahn et al. | | |
| 2016/0293575 A1 | 9/2016 | Yang et al. | | |
| 2016/0343335 A1 | 11/2016 | Cao | | |
| 2017/0108989 A1 | 4/2017 | Gu et al. | | |
| 2018/0294040 A1 | 10/2018 | Hao et al. | | |

FOREIGN PATENT DOCUMENTS

| | | |
|---|---|---|
| CN | 105185343 A | 12/2015 |
| CN | 105609135 A | 5/2016 |

\* cited by examiner

CLOCK SIGNAL TRANSMISSION CIRCUIT AND DRIVING METHOD THEREOF, GATE DRIVING CIRCUIT, AND DISPLAY DEVICE

CROSS REFERENCE OF A RELATED APPLICATION

This disclosure claims the benefit of the Chinese patent application 201710066108.4, entitled "Clock Signal Transmission Circuit and Drive Method thereof, Gate Driving Circuit and Display Device," filed on Feb. 6, 2017, which is hereby incorporated herein by reference.

TECHNICAL FIELD

Embodiments of the present disclosure relate to a display technique, and more particularly to a clock signal transmission circuit and a driving method thereof, a gate driving circuit, and a display device.

BACKGROUND

When a display unit is switched on, sudden access to a power supply may cause unpredictable voltage fluctuations on some lines. For example, there might have been an undesired high voltage on a clock signal line coupled to a gate driving circuit before the display of an image is started. At this point, the high voltage on the clock signal line may cause a shift register unit (for example, transistors therein) in the gate driving circuit to malfunction. In the case where the gate driving circuit is integrated on an array substrate (GOA), it is difficult to produce additional filtering or protection circuits due to limitations of the manufacturing process. Accordingly, such a case is particularly likely to occur.

When the shift register unit in the gate driving circuit malfunctions, the power supply chip may be readily short-circuited, resulting in a high-current overload. The high-current overload, on the one hand, may readily damage the circuits and shorten the life of the display device and, on the other hand, will lead to a protective shut-down of the power supply chip, so that the display device may present a black screen after its power-on.

Therefore, there is still a need for improvements of an existing display device.

SUMMARY

Embodiments of the present disclosure provide a clock signal transmission circuit, a driving method thereof, a gate driving circuit, and a display device.

According to an aspect of the present disclosure, a clock signal transmission circuit is provided, which comprises: an input circuit, a pull-up circuit, a reset circuit, a pull-down control circuit, a pull-down circuit, and a pull-up holding circuit. The input circuit is coupled to an input signal terminal and a pull-up point, and is configured to cause a voltage at the pull-up point to be an enabling voltage under the control of a voltage at the input signal terminal. The pull-up circuit is coupled to the pull-up point, a clock signal terminal and an output signal terminal, and is configured to couple the clock signal terminal to the output signal terminal under the control of a voltage at the pull-up point. The reset circuit is coupled to a reset signal terminal, a first voltage terminal and the pull-up point, and is configured to couple the first voltage terminal to the pull-up point under the control of a voltage at the reset signal terminal. The pull-down control circuit is coupled to the pull-up point, the first voltage terminal, a second voltage terminal and a pull-down point, and is configured to selectively couple one of the first voltage terminal and the second voltage terminal to the pull-down point under the control of a voltage at the pull-up point. The pull-down circuit is coupled to the pull-down point, the first voltage terminal and the output signal terminal, and is configured to couple the first voltage terminal to the output signal terminal under the control of a voltage at the pull-down point. The pull-up holding circuit is coupled to the pull-up point and a third voltage terminal, and is configured to couple the third voltage terminal to the pull-up point under the control of a voltage at the pull-up point.

In an embodiment of the present disclosure, the pull-up holding circuit comprises a first transistor. The first transistor has a control electrode coupled to the pull-up point, a first electrode coupled to the third voltage terminal, and a second electrode coupled to the pull-up point.

In an embodiment of the present disclosure, the pull-up holding circuit is further coupled to the second voltage terminal, and comprises a first transistor, a second transistor, and a third transistor. The first transistor has a control electrode coupled to the pull-up point, a first electrode coupled to the second voltage terminal, and a second electrode coupled to a control electrode of the third transistor. The second transistor has a control electrode and a first electrode coupled to the third voltage terminal, and a second electrode coupled to a first electrode of the third transistor. The third transistor has a second electrode coupled to the pull-up point.

In an embodiment of the present disclosure, the third voltage terminal is coupled to the second voltage terminal.

In an embodiment of the present disclosure, the pull-up holding circuit is further coupled to a fourth voltage terminal, and further comprises: a fourth transistor and a fifth transistor. The fourth transistor has a control electrode and a first electrode coupled to the fourth voltage terminal, and a second electrode coupled to a first electrode of the fifth transistor. The fifth transistor has a control electrode coupled to the second electrode of the first transistor, and a second electrode coupled to the pull-up point.

In an embodiment of the present disclosure, the reset circuit is further coupled to the second electrode of the first transistor, and is further configured to couple the first voltage terminal to the second electrode of the first transistor under the control of a voltage at the reset signal terminal. The reset circuit comprises a sixth transistor and a seventh transistor. The sixth transistor has a control electrode coupled to the reset signal terminal, a first electrode coupled to the pull-up point, and a second electrode coupled to the first voltage terminal. The seventh transistor has a control electrode coupled to the reset signal terminal, a first electrode coupled to the second electrode of the first transistor, and a second electrode coupled to the first voltage terminal.

In an embodiment of the present disclosure, the pull-down circuit is further coupled to the second electrode of the first transistor, and is further configured to couple the first voltage terminal to the second electrode of the first transistor under the control of a voltage at the pull-down point.

In an embodiment of the present disclosure, the pull-down circuit comprises an eighth transistor and a ninth transistor. The eighth transistor has a control electrode coupled to the pull-down point, a first electrode coupled to the second electrode of the first transistor, and a second electrode coupled to the first voltage terminal. The ninth transistor has a control electrode coupled to the pull-down point, a first electrode coupled to the output signal terminal, and a second electrode coupled to the first voltage terminal.

In an embodiment of the present disclosure, the pull-down control circuit comprises a tenth transistor and an eleventh transistor. The tenth transistor has a control electrode coupled to the pull-up point, a first electrode coupled to the pull-down point, and a second electrode coupled to the first voltage terminal. The eleventh transistor has a control electrode and a first electrode coupled to the second voltage terminal, and a second electrode coupled to the pull-down point.

In an embodiment of the present disclosure, the input circuit comprises a twelfth transistor. The twelfth transistor has a control electrode coupled to the input signal terminal, a first electrode coupled to the second voltage terminal, and a second electrode coupled to the pull-up point.

In an embodiment of the present disclosure, the input circuit comprises a twelfth transistor. The twelfth transistor has a control electrode and a first electrode coupled to the input signal terminal, and a second electrode coupled to the pull-up point.

In an embodiment of the present disclosure, the pull-up circuit comprises a thirteenth transistor. The thirteenth transistor has a control electrode coupled to the pull-up point, a first electrode coupled to the clock signal terminal, and a second electrode coupled to the output signal terminal.

According to a second aspect, an embodiment of the present disclosure provides a driving method for the above-mentioned clock signal transmission circuit, comprising: applying an enabling voltage to a reset signal terminal, and applying a disabling voltage to an input signal terminal to cause a voltage at a pull-up point to be a disabling voltage, so that the pull-up circuit decouples a clock signal terminal from an output signal terminal, and the pull-down circuit couples a first voltage terminal to the output signal terminal, wherein the output signal terminal outputs a disabling voltage. An enabling voltage is applied to the input signal terminal, and a disabling voltage is applied to the reset signal terminal to cause a voltage at the pull-up point to be an enabling voltage, so that the pull-up circuit couples the clock signal terminal to the output signal terminal, and the output signal terminal outputs a clock signal from the clock signal terminal, wherein the pull-up holding circuit holds the enabling voltage at the pull-up point.

According to a third aspect, an embodiment of the present disclosure provides a gate driving circuit comprising the above-mentioned clock signal transmission circuit and a plurality of cascaded shift register units. A clock signal source of the gate driving circuit is coupled to the clock signal terminal of the clock signal transmission circuit, and the output signal terminal of the clock signal transmission circuit is coupled to clock signal terminals of the shift register units.

According to a fourth aspect, an embodiment of the present disclosure provides a display device comprising the gate driving circuit mentioned above.

BRIEF DESCRIPTION OF THE DRAWINGS

In order to more clearly illustrate the technical solution of embodiments of the present disclosure, the drawings of the embodiments will be briefly described below. It should be understood that the drawings described below relate only to some embodiments of the disclosure and are not to be construed as limiting the disclosure, in which.

DETAILED DESCRIPTION

In order to make the technical solutions and advantages of embodiments of the present disclosure clearer, the technical solution of the embodiments of the present disclosure will be described clearly and thoroughly below with reference to the accompanying drawings. Obviously, the described embodiments are only parts, rather than all, of embodiments of the present disclosure. All other embodiments which may be obtained by those skilled in the art without any inventive efforts are also within the protection scope of the present disclosure, based on the described embodiments of the disclosure.

In the following description, as the typical understanding of those skilled in the art, an enabling voltage is a voltage applied to a circuit so as to causes the circuit to operate. For example, if the circuit is composed of an N-type transistor, the enabling voltage may be a high voltage that causes the N-type transistor to be turned on when being applied to the gate of the N-type transistor. Correspondingly, if the transistor is of P-type, the enabling voltage is a low voltage that causes the P-type transistor to be turned on when being applied to the gate of the P-type transistor. It should be understood that the words "high" and "low" herein are used only to distinguish relative amplitudes of voltages, rather than specific definitions of these voltages. For example, "high voltage" may be any of 5V, 8V, 30V, etc., while "low voltage" may be any of −5V, −8V, −30V and so on.

In addition, as will be appreciated by those skilled in the art, for a transistor, the control electrode may be the gate, the first electrode may be one of the source and the drain, and the second electrode may be the other of the source and the drain.

Additionally, as the typical understanding of those skilled in the art, A is coupled to B means that A is electrically connected to B directly or via an intermediate unit.

Figure 1:
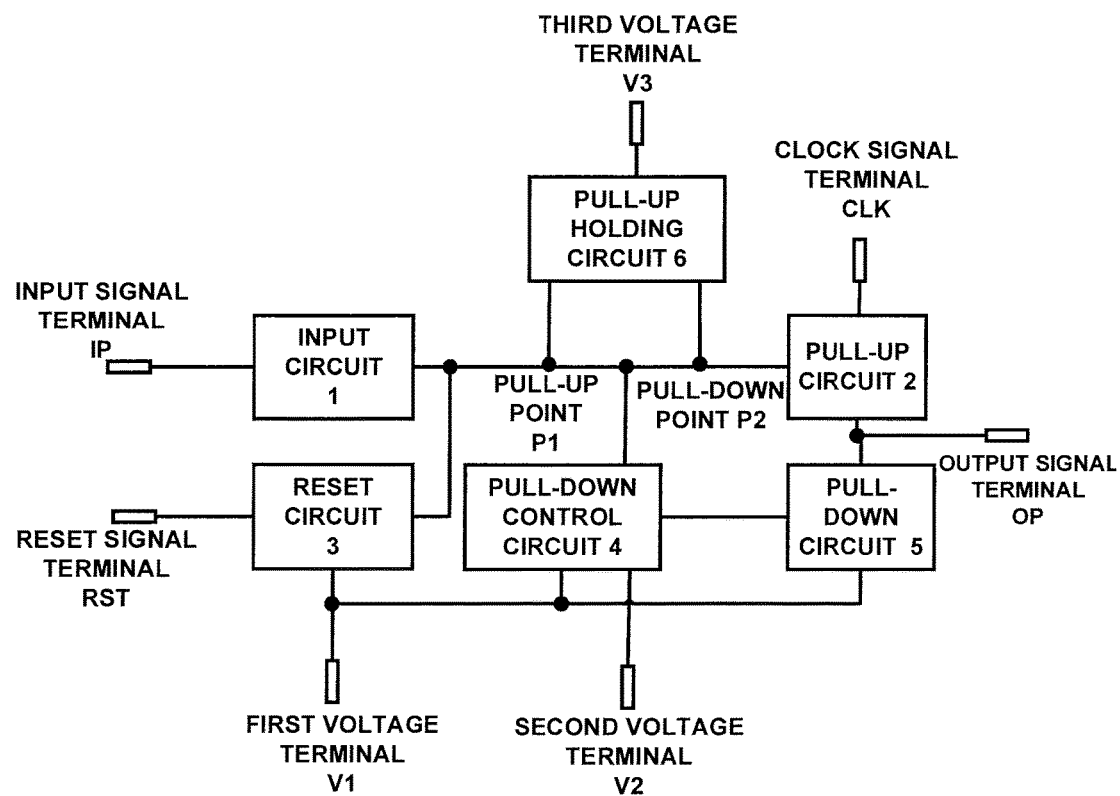
FIG. 1 is a schematic block diagram of a clock signal transmission circuit according to an embodiment of the present disclosure.

FIG. 1 is a schematic block diagram of a clock signal transmission circuit according to an embodiment of the present disclosure. As shown in FIG. 1, the clock signal transmission circuit comprises an input circuit 1, a pull-up circuit 2, a reset circuit 3, a pull-down control circuit 4, a pull-down circuit 5, and a pull-up holding circuit 6. The input circuit 1 is coupled to an input signal terminal IP and a pull-up point P1, and is configured to cause a voltage at the pull-up point P1 to be an enabling voltage under the control of a voltage at the input signal terminal IP. The pull-up circuit 2 is coupled to the pull-up point P1, a clock signal terminal CLK and an output signal terminal OP, and is configured to couple the clock signal terminal CLK to the output signal terminal OP under the control of a voltage at the pull-up point P1. The reset circuit 3 is coupled to a reset signal terminal RST, a first voltage terminal V1 and the pull-up point P1, and is configured to couple the first voltage terminal V1 to the pull-up point P1 under the control of a voltage at the reset signal terminal RST. The pull-down control circuit 4 is coupled to the pull-up point P1, the first voltage terminal V1, a second voltage terminal V2 and a pull-down point P2, and is configured to selectively couple one of the first voltage terminal V1 and the second voltage terminal V2 to the pull-down point P2 under the control of a voltage at the pull-up point P1. The pull-down circuit 5 is coupled to the pull-down point P2, the first voltage terminal V1 and the output signal terminal OP, and is configured to couple the first voltage terminal V1 to the output signal terminal OP under the control of a voltage at the pull-down point P2. The pull-up holding circuit 6 is coupled to the pull-up point P1 and a third voltage terminal V3, and is configured to couple the third voltage terminal V3 to the pull-up point P1 under the control of a voltage at the pull-up point P1.

The clock signal transmission circuit may be provided between the clock signal source and each shift register unit of the gate driving circuit, where the clock signal terminal CLK is coupled to the clock signal source, and the output signal terminal OP is coupled to each shift register unit of the gate driving circuit. When the input signal terminal IP is applied with a disabling voltage, a voltage at the pull-up point P1 remains disabled, and the pull-up circuit 2 causes the clock signal terminal CLK to be disconnected from the output signal terminal OP. Shift register units of the gate driving circuit then will not receive the clock signal in any forms, which can prevent malfunctions of the gate driving circuit caused by an undesired high voltage on the clock signal line. After the input signal terminal IP is applied with an enabling voltage, a voltage at the pull-up point P1 remains enabled, and the pull-up circuit 2 causes the clock signal terminal CLK to be coupled to the output signal terminal OP. Each shift register unit of the gate driving circuit receives a clock signal from the clock source, and operates normally. By the utilization of the pull-up holding circuit 6, once the voltage at the pull-up point P1 is enabled, a third voltage terminal V3 is coupled to the pull-up point P1, and the enabling voltage at the pull-up point P1 will be maintained. Thereafter, even if the voltage at the input signal terminal IP has been changed to be disabled, the voltage at the pull-up point P1 can also remain enabled, and the coupling between the clock signal terminal CLK and the output signal terminal OP will be maintained.

According to the clock signal transmission circuit of the embodiment of the present disclosure, it is possible to decouple the clock signal source from shift register units in the gate driving circuit before the display device displays a screen, preventing malfunctions of the gate driving circuit caused by an undesired high voltage on the clock signal line.

Figure 2:
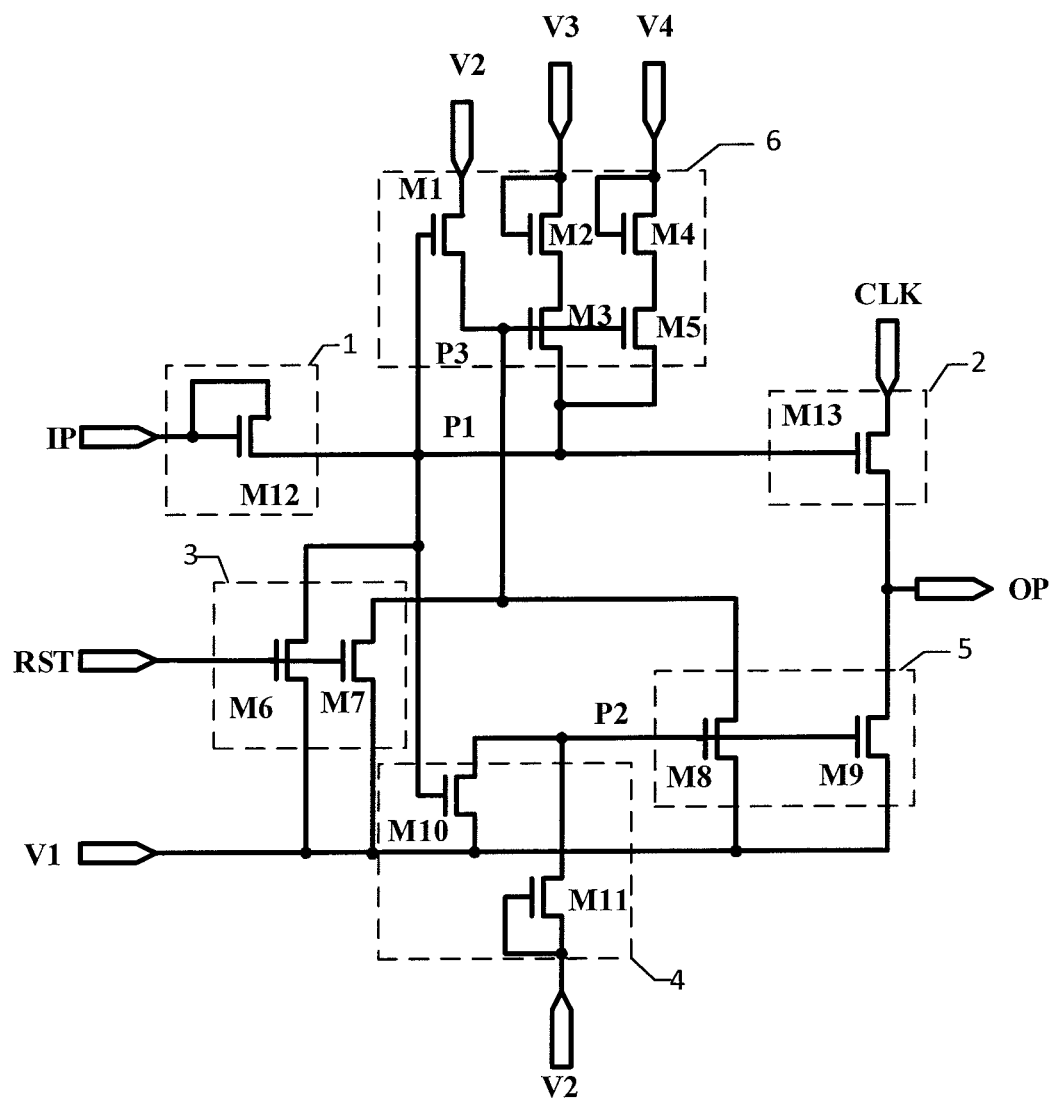
FIG. 2 is a schematic circuit diagram of the clock signal transmission circuit shown in FIG. 1.

FIG. 2 is a schematic flow diagram of the driving method for the clock signal transmission circuit shown in FIG. 1. As shown in FIG. 2, the pull-up holding circuit 6 is further coupled to the second voltage terminal V2 and a fourth voltage terminal V4, and the pull-up holding circuit 6 comprises a first transistor M1, a second transistor M2, a third transistor M3, a fourth transistor M4, and a fifth transistor M5. The first transistor M1 has a control electrode coupled to the pull-up point P1, a first electrode coupled to the second voltage terminal V2, and a second electrode P3 coupled to a control electrode of the third transistor M3 and a control electrode of the fifth transistor M5. The second transistor M2 has a control electrode and a first electrode coupled to the third voltage terminal V3, and a second electrode coupled to a first electrode of the third transistor M3. The third transistor M3 has a second electrode coupled to the pull-up point P1. The fourth transistor M4 has a control electrode and a first electrode coupled to a fourth voltage terminal V4, and a second electrode coupled to a first electrode of the fifth transistor M5. The fifth transistor M5 has a control electrode coupled to the second electrode P3 of the first transistor M1, and a second electrode coupled to the pull-up point P1.

The enabling voltage at the pull-up point P1 causes the first transistor M1 to be turned on to couple the second voltage terminal V2 to the control electrode of the third transistor M3 and to the control electrode of the fifth transistor M5. The enabling voltage at the second voltage terminal V2 will cause the third transistor M3 and the fifth transistor M5 to turn on. Thereafter, when the voltage at the third voltage terminal V3 is enabled, the second transistor M2 is turned on, and the third voltage terminal V3 is coupled to the pull-up point P1 via the second transistor M2 and the third transistor M3. When the voltage at the fourth voltage terminal V4 is enabled, the fourth transistor M4 is turned on, and the fourth voltage terminal V4 is coupled to the pull-up point P1 via the fourth transistor M4 and the fifth transistor M5.

According to the above structure, when the voltage at the second voltage terminal V2 remains enabled and at least one of the voltage at the third voltage terminal V3 and the voltage of the fourth voltage terminal V4 remains enabled, the voltage at the pull-up point P1 will remain enabled. This is particularly applicable to a gate driving circuit having a plurality of power supplies. In the gate driving circuit, the voltage of one power supply is always enabled and can be connected to the second voltage terminal V2; the voltage of one power supply is always disabled and can be connected to the first voltage terminal V1; and voltages of a pair of power supplies are switched between enabled and disabled, and the voltages of the two power supplies in this pair are always opposite each other (i.e., one is always enabled and the other is always disabled), this pair of power supplies can be connected to the third voltage terminal V3 and the fourth voltage terminal V4, respectively. Thus, the second transistor M2 and the third transistor M3 are turned on for a certain period of time, and the fourth transistor M4 and the fifth transistor M5 are turned on for the remaining period of time. The alternate turning-on of the transistors can extend their lifetime.

As shown in FIG. 2, the reset circuit 3 is further coupled to the second electrode P3 of the first transistor M1, and is further configured to couple the first voltage terminal V1 to the second electrode P3 of the first transistor M1 under the control of a voltage at the reset signal terminal RST. The reset circuit 3 comprises a sixth transistor M6 and a seventh transistor M7. The sixth transistor M6 has a control electrode coupled to the reset signal terminal RST, a first electrode coupled to the pull-up point P1, and a second electrode coupled to the first voltage terminal V1. The seventh transistor M7 has a control electrode coupled to the reset signal terminal RST, a first electrode coupled to the second electrode P3 of the first transistor M1, and a second electrode coupled to the first voltage terminal V1.

When the voltage at the reset signal terminal RST is enabled, the sixth transistor M6 is turned on so that the pull-up point P1 is coupled to the first voltage terminal V1 and the voltage at the pull-up point P1 is disabled. The pull-up circuit 2 is turned off, and the clock signal terminal CLK is disconnected from the output signal terminal OP. In addition, the seventh transistor M7 is turned on, the second electrode P3 of the first transistor M1 is coupled to the first voltage terminal V1, and the voltage at the second electrode P3 of the first transistor M1 is disabled. The third transistor M3 and the fifth transistor M5 in the pull-up holding circuit 6 are turned off, disconnecting the third voltage terminal V3 and the fourth voltage terminal V4 from the pull-up point P1, and ensuring that the voltage of the pull-up point P1 is disabled. It will be appreciated that the seventh transistor M7 may also be omitted without affecting the basic functions of the circuit.

As shown in FIG. 2, in an embodiment of the present disclosure, the pull-down circuit 5 is further coupled to the second electrode P3 of the first transistor M1, and is further configured to couple the first voltage terminal V1 to the second electrode P3 of the first transistor M1 under the control of a voltage at the pull-down point P2. The pull-down circuit 5 comprises an eighth transistor M8 and a ninth transistor M9. The eighth transistor M8 has a control electrode coupled to the pull-down point P2, a first electrode coupled to the second electrode P3 of the first transistor M1, and a second electrode coupled to the first voltage terminal V1. The ninth transistor M9 has a control electrode coupled to the pull-down point P2, a first electrode coupled to the output signal terminal OP, and a second electrode coupled to the first voltage terminal V1. It will be appreciated that the eighth transistor M8 may also be omitted without affecting the basic functions of the circuit.

When the voltage at the pull-down point P2 is enabled, the ninth transistor M9 is turned on and the output signal terminal OP is coupled to the first voltage terminal V1. The voltage at the output signal terminal OP remains disabled, so that the output signal terminal OP can be prevented from outputting an undesired voltage (for example, a high voltage). In addition, the eighth transistor M8 is turned on, the second electrode P3 of the first transistor M1 is coupled to the first voltage terminal V1, and the voltage at the second electrode P3 of the first transistor M1 is disabled. The third transistor M3 and the fourth transistor M4 in the pull-up holding circuit 6 are turned off, disconnecting the third voltage terminal V3 and the fourth voltage terminal V4 from the pull-up point P1. It will be appreciated that the eighth transistor M8 may also be omitted.

As shown in FIG. 2, in an embodiment of the present disclosure, the pull-down control circuit 4 comprises a tenth transistor M10 and an eleventh transistor M11. The tenth transistor M10 has a control electrode coupled to the pull-up point P1, a first electrode coupled to the pull-down point P2, and a second electrode coupled to the first voltage terminal V1. The eleventh transistor M11 has a control electrode and a first electrode coupled to the second voltage terminal V2, and a second electrode coupled to the pull-down point P2.

When the voltage at the pull-up point P1 is disabled, the eleventh transistor M11 causes the pull-down point P2 to be coupled to the second voltage terminal V2, and the second voltage terminal V2 supplies an enabling voltage. The voltage at the pull-down point P2 is enabled, the pull-down circuit 5 causes the output signal terminal OP to be coupled to the first voltage terminal V1, and the output signal terminal OP outputs a disabling voltage. Further, the voltage at the pull-up point P1 is enabled, the tenth transistor M10 causes the pull-down point P2 to be coupled to the first voltage terminal V1, and the first voltage terminal V1 supplies a disabling voltage, so that the pull-down circuit 5 causes the output signal terminal OP to be disconnected from the first voltage terminal V1, and that the output signal terminal OP outputs the clock signal from the clock signal terminal CLK.

In the above circuit structure, when the pull-down point P2 is coupled to the first voltage terminal V1 via the tenth transistor M10, it is still coupled to the second voltage terminal V2 via the eleventh transistor M11. In this case, the parameters of the tenth transistor M10 and the eleventh transistor M11 (e.g., the breadth-length ratio, etc.) can be set so that the conductivity of the tenth transistor M10 is higher than that of the eleventh transistor M11, thereby the voltage at the pull-down point P2 is the voltage at the first voltage terminal V1. In order to simplify the manufacturing process, the transistors in the circuit may all have the same parameters. In this case, two transistors, which are connected in parallel, can be used as the tenth transistor M10 to enhance the conductivity, wherein the control electrodes, the first electrodes and the second electrodes of these two transistors are connected correspondingly, and the control is the same as that in the case of one transistor.

As shown in FIG. 2, in an embodiment of the present disclosure, the input circuit 1 comprises a twelfth transistor M12. The twelfth transistor M12 has a control electrode coupled to the input signal terminal IP, a first electrode coupled to the second voltage terminal V2, and a second electrode coupled to the pull-up point P1.

When the voltage at the input signal terminal IP is enabled, the twelfth transistor M12 is turned on so that the second voltage terminal V2 is coupled to the pull-up point P1 and the voltage at the pull-up point P1 is enabled.

As shown in FIG. 2, in an embodiment of the present disclosure, the pull-up circuit 2 comprises a thirteenth transistor M13. The thirteenth transistor M13 has a control electrode coupled to the pull-up point P1, a first electrode coupled to the clock signal terminal CLK, and a second electrode coupled to the output signal terminal OP.

When the voltage at the pull-up point P1 is enabled, the thirteenth transistor M13 is turned on so that the clock signal terminal CLK is coupled with the output signal terminal OP, and the output signal terminal OP outputs the clock signal from the clock signal terminal CLK.

The clock signal transmission circuit in the embodiment of the present disclosure can be implemented as a circuit composed of transistors, which facilitates the clock signal transmission circuit to be integrated into an array substrate and formed simultaneously by the process the same as that used for the shift register units in the gate driving circuit, without increasing the cost.

Figure 3:
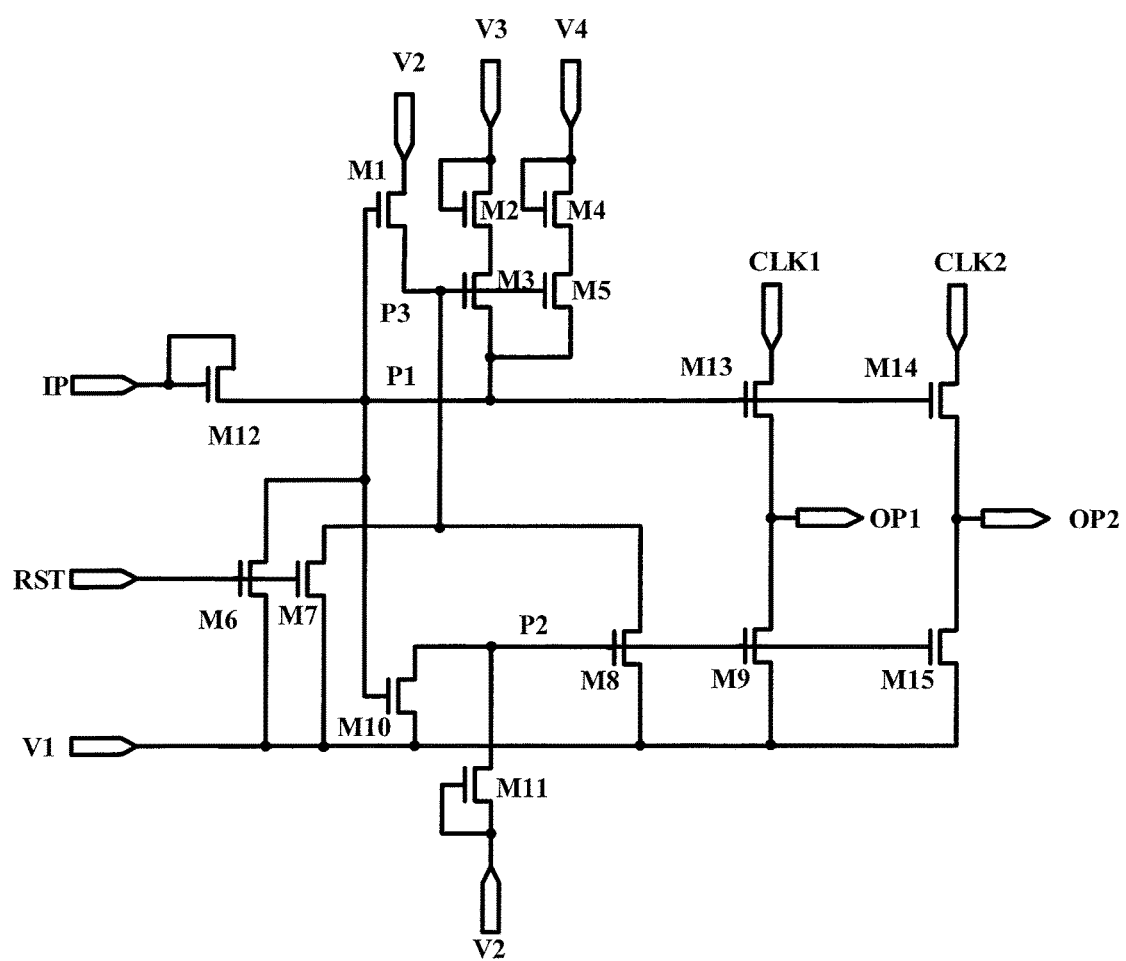
FIG. 3 is another schematic circuit diagram of the clock signal transmission circuit shown in FIG. 1.

FIG. 3 is a schematic flow diagram of the driving method for the clock signal transmission circuit shown in FIG. 1. As shown in FIG. 3, there may be a plurality of clock signal terminals, for example the first clock signal terminal CLK1 and the second clock signal terminal CLK2 (and corresponding first output signal terminal OP1 and second output signal terminal OP2), in a clock signal transmission circuit. FIG. 3 is used to illustrate the case where the shift register units in the gate driving circuit require a plurality of synchronously input clock signals.

Parts of FIG. 3 which are the same as those in FIG. 2 will not be described repeatedly. As shown in FIG. 3, on the basis of the circuit of FIG. 2, the pull-up circuit 2 further comprises a fourteenth transistor M14. The fourteenth transistor M14 has a control electrode coupled to the pull-up point P1, a first electrode coupled to the second clock signal terminal CLK2, and a second electrode coupled to the second output signal terminal OP2. During the operation of the clock signal transmission circuit, the state of the fourteenth transistor M14 is exactly the same as that of the thirteenth transistor M13.

The pull-up circuit 2 further comprises a fifth transistor M15. The fifth transistor M15 has a control electrode coupled to the pull-down point P2, a first electrode coupled to the second output signal terminal OP2, and a second electrode coupled to the first voltage terminal V1. During the operation of the clock signal transmission circuit, the state of the fifth transistor M15 is exactly the same as that of the ninth transistor M9.

The clock signal transmission circuit of the embodiment of the present disclosure can be used for synchronously inputting a plurality of clock signals. It will be appreciated that a plurality of circuit structures as shown in FIG. 2 may also be provided to achieve an asynchronous transmission of a plurality of clock signals. Here voltages at the input signal terminals IP of the plurality of clock signal transmission circuits can be changed asynchronously from disabled to enabled in order to achieve an asynchronous transmission of the plurality of clock signals.

Figure 4:
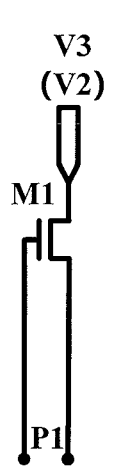
FIG. 4 is a schematic diagram showing a structure in which a pull-up holding circuit is constituted by one transistor.

FIG. 4 is a schematic diagram showing a structure in which a pull-up holding circuit 6 is constituted by one transistor. As shown in FIG. 4, the pull-up holding circuit 6 comprises a first transistor M1. The first transistor M1 has a control electrode coupled to the pull-up point P1, a first electrode coupled to the third voltage terminal V3, and a second electrode coupled to the pull-up point P1. This structure is simple and easy to be implemented.

Figure 5:
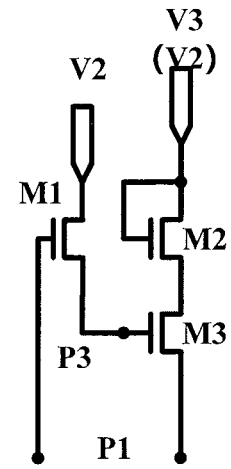
FIG. 5 is a schematic diagram showing a structure in which a pull-up holding circuit is constituted by three transistors.

FIG. 5 is a schematic diagram showing a structure in which a pull-up holding circuit 6 is constituted by three transistors. As shown in FIG. 5, the pull-up holding circuit 6 comprises a first transistor M1, a second transistor M2, and a third transistor M3. The first transistor M1 has a control electrode coupled to the pull-up point P1, a first electrode coupled to the second voltage terminal V2, and a second electrode coupled to a control electrode of the third transistor M3. The second transistor M2 has a control electrode and a first electrode coupled to the third voltage terminal V3, and a second electrode coupled to a first electrode of the third transistor M3. The third transistor M3 has a second electrode coupled to the pull-up point P1. In this structure, two transistors are provided between the pull-up point P1 and the third voltage terminal V3, which may reduce the mutual influence between the voltage of the pull-up point P1 and the voltage of the third voltage terminal V3, and improve the reliability of the circuit.

In the structures of FIGS. 4 and 5, the voltage at the third voltage terminal V3 needs to be always enabled, and therefore the third voltage terminal V3 may also be coupled to the second voltage terminal V2 to reduce the number of lines, which may improve the reliability and reduce the cost, and is applicable to the gate driving circuits with a small number of power supplies.

Figure 6:
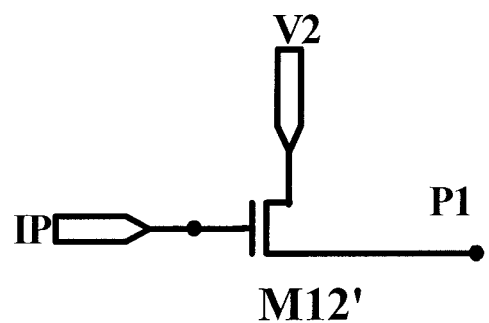
FIG. 6 is another schematic diagram of the input circuit shown in FIG. 1.

FIG. 6 is another schematic diagram of the input circuit 1 shown in FIG. 1. As shown in FIG. 6, the input circuit 1 comprises a twelfth transistor M12'. The twelfth transistor M12' has a control electrode coupled to the input signal terminal IP, a first electrode coupled to the second voltage terminal V2, and a second electrode coupled to the pull-up point P1. When the enabling voltage required for turning on the twelfth transistor M12' is the same as the enabling voltage available at the second voltage terminal V2 (e.g., having the same amplitude), the control electrode and the first electrode of the twelfth transistor M12' can be coupled to the input signal terminal IP to reduce the number of lines.

Figure 7:
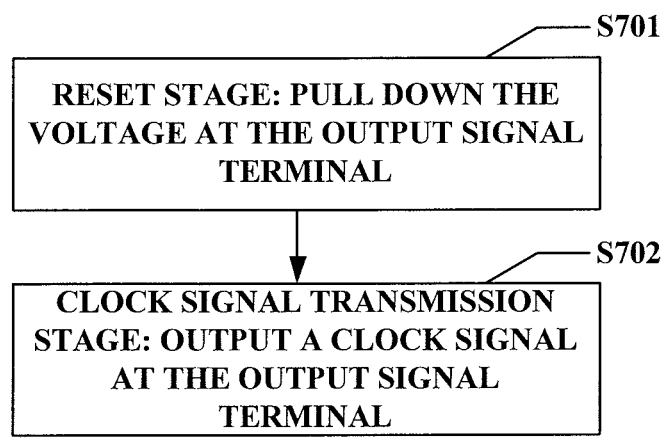
FIG. 7 is a schematic flow diagram of the driving method for the clock signal transmission circuit shown in FIG. 1.
Figure 8:
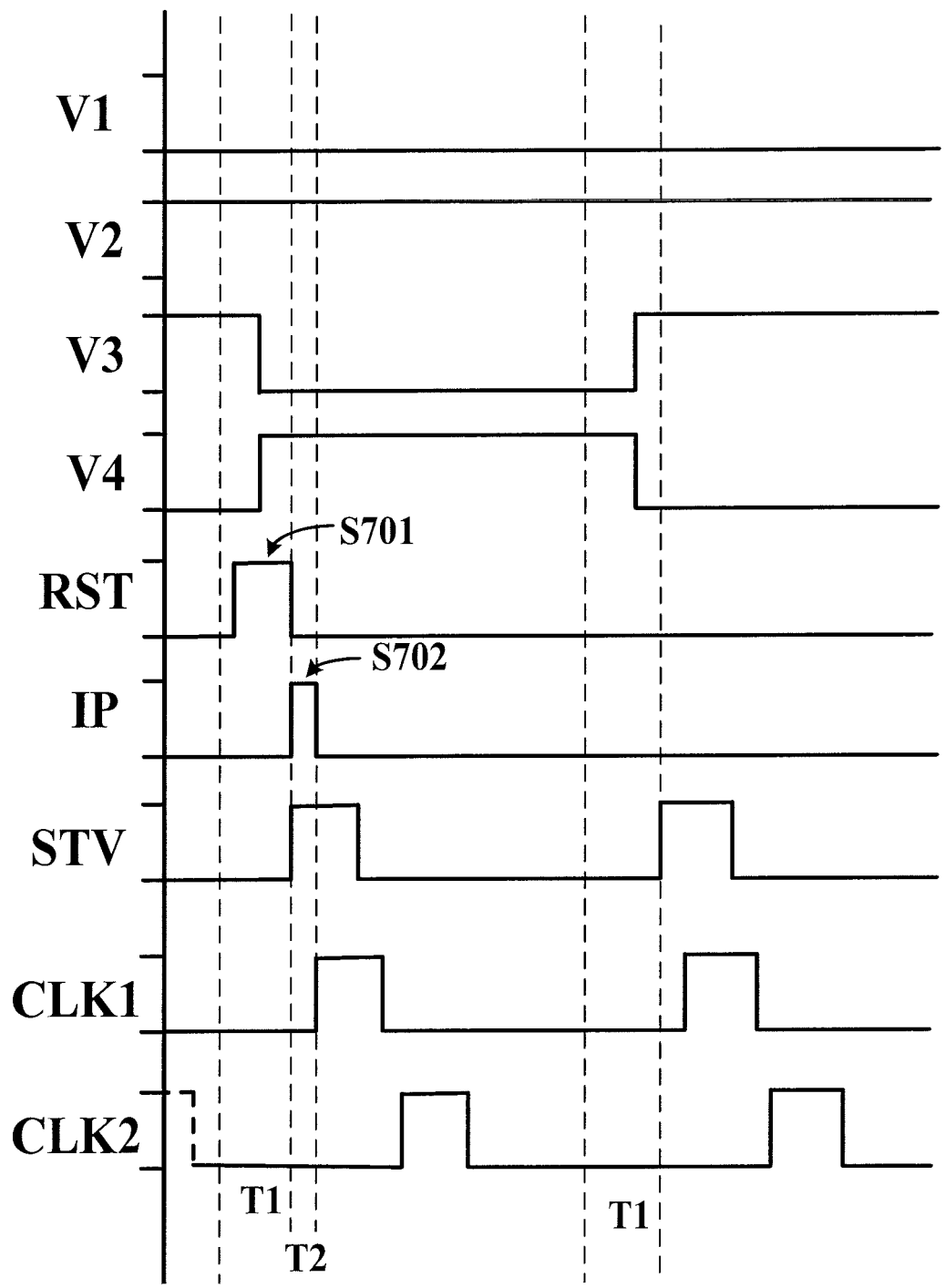
FIG. 8 is a timing diagram of the clock signal transmission circuit of FIG. 7.

FIG. 7 is a schematic flow diagram of the driving method for the clock signal transmission circuit shown in FIG. 1. FIG. 8 is a timing diagram of the clock signal transmission circuit of FIG. 7. The operation of the clock signal transmission circuit will be described in detail with reference to FIGS. 2, 7 and 8, and exemplified by the transistors in FIG. 2 which are of N-type.

As shown in FIG. 8, the first voltage terminal V1 is connected to a voltage source which supplies a low voltage, the second voltage terminal V2 is connected to a voltage source which supplies a high voltage, and the third voltage terminal V3 and the fourth voltage terminal V4 are connected to a pair of voltage sources the voltages of which are alternately converted. The clock signal terminals CLK1, CLK2 are connected to corresponding clock sources. In the figure, T1 shows a blanking stage during which the voltages of the third voltage terminal V3 and the fourth voltage terminal V4 are converted. T2 shows the duration of the enabling voltage at the input signal terminal IP.

As shown in FIG. 7, the driving method for a clock signal transmission circuit starts at step S701, i.e., the reset stage. In the reset stage, an enabling voltage is applied to a reset signal terminal RST, and a disabling voltage is applied to an input signal terminal IP to cause a voltage at a pull-up point P1 to be a disabling voltage, so that the pull-up circuit 2 decouples a clock signal terminal CLK from an output signal terminal OP, and the pull-down circuit 5 couples a first voltage terminal V1 to the output signal terminal OP, wherein the output signal terminal OP outputs a disabling voltage. Step S701 may be performed in any blanking stage T1 to better match the timing of the screen display. There is no limitation for the duration of the enabling voltage at the reset signal terminal RST, and the enabling voltage at the reset signal terminal RST may be continued until the scan start signal STV used by the gate driving circuit is enabled, so that the shift register units in the gate driving circuit will not receive the clock signal before they start to operate.

Referring to both FIGS. 2 and 8, specifically, a high voltage at the reset signal terminal RST causes the sixth transistor M6 and the seventh transistor M7 to be turned on, so that the pull-up point P1 is coupled to the first voltage terminal V1 via the sixth transistor M6, and the second electrode P3 of the first transistor M1 is coupled to the first voltage terminal V1 via the seventh transistor M7. The low voltage at the first voltage terminal V1 is applied to the pull-up point P1 and the second electrode P3 of the first transistor M1. A low voltage at the pull-up point P1 causes the first transistor M1 to be turned off, and the low voltage at the second electrode P3 of the first transistor M1 causes the third transistor M3 and the fifth transistor M5 to be turned off, so that the second voltage terminal V2, the third voltage terminal V3, and the fourth voltage terminal V4 are disconnected from the pull-up point P1, and the low voltage at the pull-up point P1 is maintained. The low voltage at the pull-up point P1 causes the thirteenth transistor M13 to be turned off, so that the clock signal terminal CLK is disconnected from the output signal terminal OP. The low voltage at the pull-up point P1 causes the tenth transistor M10 to be turned off so that the pull-down point P2 is disconnected from the first voltage terminal V1. A high voltage at the second voltage terminal V2 causes the eleventh transistor M11 to be turned on, so that the pull-down point P2 is coupled to the second voltage terminal V2 via the eleventh transistor M11. The high voltage at the second voltage terminal V2 is applied to the pull-down point P2. The high voltage at the pull-down point P2 causes the eighth transistor M8 and the ninth transistor M9 to be turned on, so that the second electrode P3 of the first transistor M1 is further coupled to the first voltage terminal V1 via the eighth transistor M8. The output signal terminal OP is coupled to the first voltage terminal V1 via the ninth transistor M9. A low voltage at the first voltage terminal V1 is applied to the output signal terminal OP, and the output signal terminal OP outputs a low voltage.

In the reset stage, the pull-up point P1 is coupled to the first voltage terminal V1 to prevent an abnormal fluctuation of the voltage at the pull-up point P1, thereby effectively preventing an abnormal turning-on of the thirteenth transistor M13 in the pull-up circuit 2.

Then, the process proceeds to step S702, i.e., the clock signal transmission stage. During the clock signal transmission stage, an enabling voltage is applied to the input signal terminal IP, and a disabling voltage is applied to the reset signal terminal RST to cause a voltage at the pull-up point P1 to be an enabling voltage, so that the pull-up circuit 2 couples the clock signal terminal CLK to the output signal terminal OP, and the output signal terminal OP outputs a clock signal from the clock signal terminal CLK, wherein the pull-up holding circuit 6 holds the enabling voltage at the pull-up point P1.

Referring to both FIGS. 2 and 8, specifically, a high voltage at the input signal terminal IP causes the twelfth transistor M12 to be turned on, so that the pull-up point P1 is coupled to the input signal terminal IP via the twelfth transistor M12, and the high voltage at the input signal terminal IP is applied to the pull-up point P1.

The high voltage at the pull-up point P1 causes the first transistor M1 to be turned on and the high voltage at the second voltage terminal V2 is applied to the second electrode P3 of the first transistor M1, so that the third transistor M3 and the fifth transistor M5 are turned on. When the voltage at the third voltage terminal V3 is high, the second transistor M2 is turned on, and the pull-up point P1 is coupled to the third voltage terminal V3 via the second transistor M2 and the third transistor M3, maintaining the high voltage at the pull-up point P1. When the voltage at the fourth voltage terminal V4 is high, the fourth transistor M4 is turned on, and the pull-up point P1 is coupled to the fourth voltage terminal V4 via the fourth transistor M4 and the fifth transistor M5, maintaining the high voltage at the pull-up point P1. Since one of the voltages at the third voltage terminal V3 and the fourth voltage terminal V4 will be a high voltage at any time, the high voltage at the pull-up point P1 can be well maintained.

The high voltage at the pull-up point P1 causes the thirteenth transistor M13 to be turned on, so that the output signal terminal OP is coupled to the clock signal terminal CLK via the thirteenth transistor M13, and the output signal terminal OP outputs a clock signal.

In addition, the high voltage at the pull-up point P1 causes the tenth transistor M10 to be turned on, so that the pull-down point P2 is coupled to the first voltage terminal V1 via the tenth transistor M10, and coupled to the second voltage terminal V2 via the eleventh transistor M11. As described above, the conductivity of the tenth transistor M10 may be set to be higher than that of the eleventh transistor M11, and then the voltage at the pull-down point P2 is the low voltage at the first voltage terminal V1. The low voltage at the pull-down point P2 causes the eighth transistor M8 and the ninth transistor M9 to be turned off, which disconnects the second electrode P3 of the first transistor M1 and the output signal terminal OP from the first voltage terminal V1, preventing the low voltage at the first voltage terminal V1 from affecting the voltage at pull-up point P1 and the voltage at the output signal terminal OP.

During the clock signal transmission stage, the pull-up point P1 is stably coupled to the third voltage terminal V3 or the fourth voltage terminal V4 to ensure the transmission of the clock signal.

In an embodiment of the present disclosure, the voltage sources to which the first, second, third, and fourth voltage terminals are connected may be voltage sources used by an existing gate driving circuit, which may reduce the number of lines. In addition, there is no limitation in embodiments of the present disclosure for signal sources to which the input signal terminal IP and the reset signal terminal RST are connected, as long as the above timing is satisfied.

For example, FIG. 8 further shows the waveform of the scan start signal STV used by the gate driving circuit, and the input signal terminal IP may also reuse this signal. In this case, when the scan start signal STV has a high voltage, the twelfth transistor M12 is turned on so that the voltage at the pull-up point P1 is a high voltage. When the scan start signal STV has a low voltage, the twelfth transistor M12 is turned off, which disconnects the pull-up point P1 from the input signal terminal IP.

Further, when the scan start signal STV is reused, as shown in FIG. 6, one may cause the control electrode of the twelfth transistor M12' to be coupled to the input signal terminal IP and the first electrode of the twelfth transistor M12' to be coupled to the second voltage terminal V2, which may prevent a potential effect of the voltage at the pull-up point P1 on the scan start signal STV.

For the reset signal terminal RST, if the existing gate driving circuit uses a signal RTA that is used to reset once all the shift register units before the shift register units start to operate, this signal can also be reused at the reset signal terminal RST.

Figure 9:
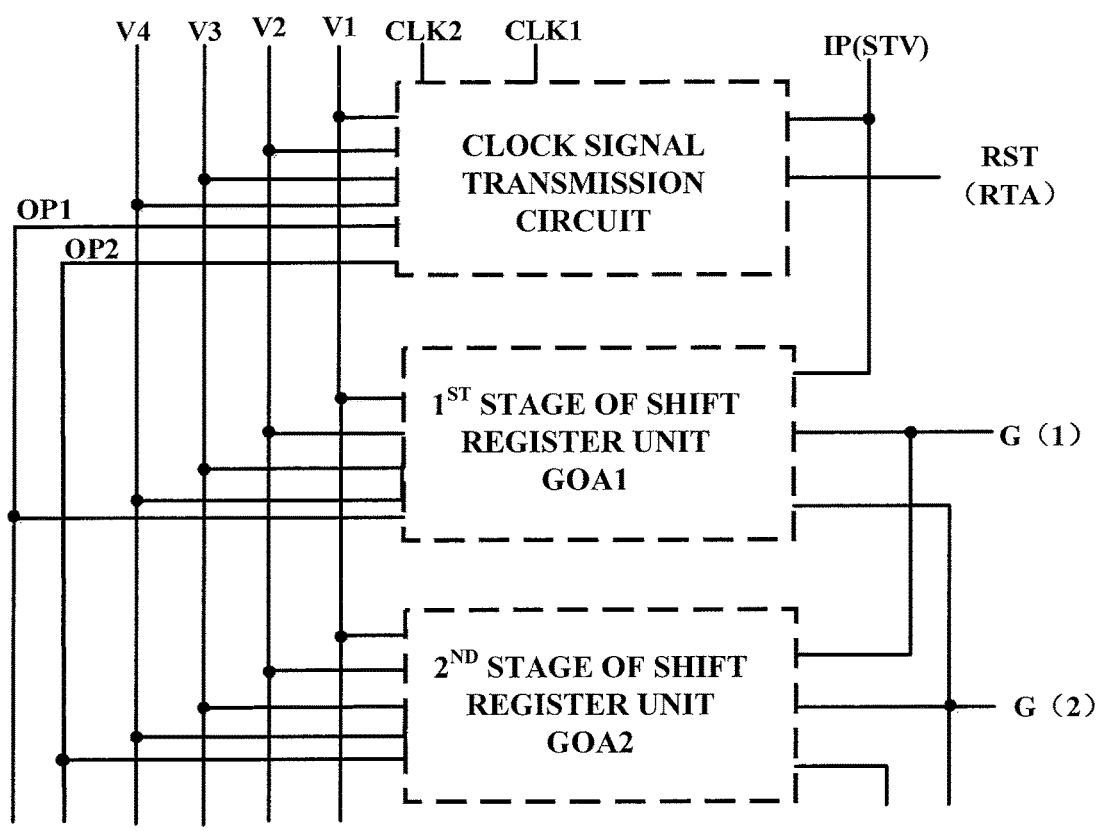
FIG. 9 is a schematic diagram of a structure of the gate driving circuit according to an embodiment of the present disclosure.

FIG. 9 is a schematic diagram of a structure of the gate driving circuit according to an embodiment of the present disclosure. As shown in FIG. 9, the gate driving circuit comprises the above-mentioned clock signal transmission circuit and a plurality of cascaded shift register units. A clock signal source of the gate driving circuit is coupled to the clock signal terminal of the clock signal transmission circuit, and the output signal terminal of the clock signal transmission circuit is coupled to clock signal terminals of the shift register units.

In the gate driving circuit, the clock signal transmission circuit can decouple the clock signal source from each shift register unit in the gate driving circuit before the display device displays a screen, preventing malfunctions of the gate driving circuit caused by an undesired high voltage on the clock signal line.

Furthermore, an embodiment of the present disclosure further provides a display device comprising the gate driving circuit mentioned above. The display device may be any product or component having a display function, such as an electronic paper, a mobile phone, a tablet computer, a television set, a monitor, a notebook computer, a digital photo frame, a navigator, or the like.

The display device according to the embodiment of the present disclosure can decouple the clock signal source from each shift register unit in the gate driving circuit before a screen is displayed, preventing malfunctions of the gate driving circuit caused by an undesired high voltage on the clock signal line.

It is to be understood that the above embodiments are merely illustrative embodiments for the purpose of illustrating the principles of the disclosure, but the disclosure is not limited thereto. It will be apparent to those skilled in the art that various changes and modifications can be made therein without departing from the spirit and essence of the disclosure, which are also considered to be within the protection scope of the present disclosure.

We claim:

1. A clock signal transmission circuit, comprising:
   an input circuit coupled to an input signal terminal and a pull-up point, and configured to cause a voltage at the pull-up point to be an enabling voltage under the control of a voltage at the input signal terminal;
   a pull-up circuit coupled to the pull-up point, a clock signal terminal and an output signal terminal, and configured to couple the clock signal terminal to the output signal terminal under the control of a voltage at the pull-up point;
   a reset circuit coupled to a reset signal terminal, a first voltage terminal and the pull-up point, and configured to couple the first voltage terminal to the pull-up point under the control of a voltage at the reset signal terminal;
   a pull-down control circuit coupled to the pull-up point, the first voltage terminal, a second voltage terminal and a pull-down point, and configured to selectively couple one of the first voltage terminal and the second voltage terminal to the pull-down point under the control of a voltage at the pull-up point;
   a pull-down circuit coupled to the pull-down point, the first voltage terminal and the output signal terminal, and configured to couple the first voltage terminal to the output signal terminal under the control of a voltage at the pull-down point; and
   a pull-up holding circuit coupled to the pull-up point and a third voltage terminal, and configured to couple the third voltage terminal to the pull-up point under the control of a voltage at the pull-up point.

2. The clock signal transmission circuit of claim 1, wherein the pull-up holding circuit comprises a first transistor,
   wherein the first transistor has a control electrode coupled to the pull-up point, a first electrode coupled to the second voltage terminal, and a second electrode coupled to the pull-up point.

3. The clock signal transmission circuit of claim 1, wherein the pull-up holding circuit is further coupled to the second voltage terminal, and comprises a first transistor, a second transistor and a third transistor;
   wherein the first transistor has a control electrode coupled to the pull-up point, a first electrode coupled to the second voltage terminal, and a second electrode coupled to a control electrode of the third transistor;
   wherein the second transistor has a control electrode and a first electrode coupled to the third voltage terminal, and a second electrode coupled to a first electrode of the third transistor; and
   wherein the third transistor has a second electrode coupled to the pull-up point.

4. The clock signal transmission circuit of claim 2, wherein the third voltage terminal is coupled to the second voltage terminal.

5. The clock signal transmission circuit of claim 3, wherein the pull-up holding circuit is further coupled to a fourth voltage terminal, and further comprises a fourth transistor and a fifth transistor;
   wherein the fourth transistor has a control electrode and a first electrode coupled to the fourth voltage terminal, and a second electrode coupled to a first electrode of the fifth transistor; and
   wherein the fifth transistor has a control electrode coupled to the second electrode of the first transistor, and a second electrode coupled to the pull-up point.

6. The clock signal transmission circuit of claim 3, wherein the reset circuit is further coupled to the second electrode of the first transistor, and is further configured to couple the first voltage terminal to the second electrode of the first transistor under the control of a voltage at the reset signal terminal;
   wherein the reset circuit comprises a sixth transistor and a seventh transistor;
   wherein the sixth transistor has a control electrode coupled to the reset signal terminal, a first electrode coupled to the pull-up point, and a second electrode coupled to the first voltage terminal; and
   wherein the seventh transistor has a control electrode coupled to the reset signal terminal, a first electrode coupled to the second electrode of the first transistor, and s second electrode coupled to the first voltage terminal.

7. The clock signal transmission circuit of claim 4, wherein the reset circuit is further coupled to the second electrode of the first transistor, and is further configured to couple the first voltage terminal to the second electrode of the first transistor under the control of a voltage at the reset signal terminal;
   wherein the reset circuit comprises a sixth transistor and a seventh transistor;
   wherein the sixth transistor has a control electrode coupled to the reset signal terminal, a first electrode coupled to the pull-up point, and a second electrode coupled to the first voltage terminal; and
   wherein the seventh transistor has a control electrode coupled to the reset signal terminal, a first electrode coupled to the second electrode of the first transistor, and a second electrode coupled to the first voltage terminal.

8. The clock signal transmission circuit of claim 3, wherein the pull-down circuit is further coupled to the second electrode of the first transistor, and is further configured to couple the first voltage terminal to the second electrode of the first transistor under the control of a voltage at the pull-down point.

9. The clock signal transmission circuit of claim 8, wherein the pull-down circuit comprises an eighth transistor and a ninth transistor;
   wherein the eighth transistor has a control electrode coupled to the pull-down point, a first electrode coupled to the second electrode of the first transistor, and a second electrode coupled to the first voltage terminal; and
   wherein the ninth transistor has a control electrode coupled to the pull-down point, a first electrode coupled to the output signal terminal, and a second electrode coupled to the first voltage terminal.

10. The clock signal transmission circuit of claim 4, wherein the pull-down circuit is further coupled to the second electrode of the first transistor, and is further configured to couple the first voltage terminal to the second electrode of the first transistor under the control of a voltage at the pull-down point.

11. The clock signal transmission circuit of claim 10, wherein the pull-down circuit comprises an eighth transistor and a ninth transistor;
   wherein the eighth transistor has a control electrode coupled to the pull-down point, a first electrode coupled to the second electrode of the first transistor, and a second electrode coupled to the first voltage terminal; and
   wherein the ninth transistor has a control electrode coupled to the pull-down point, a first electrode coupled to the output signal terminal, and a second electrode coupled to the first voltage terminal.

12. The clock signal transmission circuit of claim 1, wherein the pull-down control circuit comprises a tenth transistor and an eleventh transistor;
   wherein the tenth transistor has a control electrode coupled to the pull-up point, a first electrode coupled to the pull-down point, and a second electrode coupled to the first voltage terminal; and
   wherein the eleventh transistor has a control electrode and a first electrode coupled to the second voltage terminal, and a second electrode coupled to the pull-down point.

13. The clock signal transmission circuit of claim 1, wherein the input circuit comprises a twelfth transistor;
   wherein the twelfth transistor has a control electrode coupled to the input signal terminal, a first electrode coupled to the second voltage terminal, and a second electrode coupled to the pull-up point.

14. The clock signal transmission circuit of claim 1, wherein the input circuit comprises a twelfth transistor;
   wherein the twelfth transistor has a control electrode and a first electrode coupled to the input signal terminal, and a second electrode coupled to the pull-up point.

15. The clock signal transmission circuit of claim 1, wherein the pull-up circuit comprises a thirteenth transistor;
   wherein the thirteenth transistor has a control electrode coupled to the pull-up point, a first electrode coupled to the clock signal terminal, and a second electrode coupled to the output signal terminal.

16. A driving method for the clock signal transmission circuit of claim 1, comprising:
   applying an enabling voltage to a reset signal terminal, and applying a disabling voltage to an input signal terminal to cause a voltage at a pull-up point to be a disabling voltage, so that the pull-up circuit decouples a clock signal terminal from an output signal terminal, and the pull-down circuit couples a first voltage terminal to the output signal terminal, wherein the output signal terminal outputs a disabling voltage; and
   applying an enabling voltage to the input signal terminal, and applying a disabling voltage to the reset signal terminal to cause a voltage at the pull-up point to be an enabling voltage, so that the pull-up circuit couples the clock signal terminal to the output signal terminal, and the output signal terminal outputs a clock signal from the clock signal terminal, wherein the pull-up holding circuit holds the enabling voltage at the pull-up point.

17. The driving method of claim 16, wherein a voltage that is always disabled is supplied to the first voltage terminal, and a voltage that is always enabled is supplied to the second voltage terminal.

18. The driving method of claim 17, wherein the voltage supplied to the third voltage terminal is opposite to the voltage supplied to the fourth voltage terminal.

19. A gate driving circuit comprising the clock signal transmission circuit of claim 1 and a plurality of cascaded shift register units; wherein a clock signal source of the gate driving circuit is coupled to the clock signal terminal of the clock signal transmission circuit, and the output signal terminal of the clock signal transmission circuit is coupled to clock signal terminals of the shift register units.

20. A display device comprising the gate driving circuit of claim 19.

* * * * *